United States Patent [19]
Liu et al.

[11] Patent Number: 5,859,463
[45] Date of Patent: Jan. 12, 1999

[54] PHOTOSENSITIVE IMAGER CONTACT PAD STRUCTURE

[75] Inventors: Jianqiang Liu, Clifton Park; Robert Forrest Kwasnick; George Edward Possin, both of Niskayuna, all of N.Y.

[73] Assignee: General Electric Company, Schenectady, N.Y.

[21] Appl. No.: 772,368

[22] Filed: Dec. 23, 1996

[51] Int. Cl.$^6$ .................................................. H01J 40/14
[52] U.S. Cl. ........................ 257/448; 257/291; 257/292; 257/293; 257/234; 257/444; 257/59; 257/673; 257/779
[58] Field of Search ........................ 257/59, 72, 88–93, 257/443–448, 459, 465, 676, 786, 910, 291, 292, 293, 234, 222–235, 673, 779

[56] References Cited

U.S. PATENT DOCUMENTS

| | | | |
|---|---|---|---|
| 5,233,181 | 8/1993 | Kwasnick et al. | 250/208.1 |
| 5,463,242 | 10/1995 | Castleberry | 257/448 |
| 5,648,654 | 7/1997 | Possin | 250/208.1 |

*Primary Examiner*—Tom Thomas
*Assistant Examiner*—Fetsum Abraham
*Attorney, Agent, or Firm*—Donald S. Ingraham; Douglas E. Stoner

[57] ABSTRACT

A method of forming a contact for a photosensitive element of a photosensitive imager including a common electrode separated from a bottom contact by intervening layers of an SiOx transistor passivation layer over the bottom contact and an SiNx diode passivation layer over the transistor passivation layer. Controlled etching through the passivation layers exposes but does not damage the thin film transistor passivation layer extending in regions beyond the common electrode, and also improves adherence of a protective gasket in such regions. The contact pad formed in this process has a layer of diode passivation material and a layer of transistor passivation material disposed between the upper common electrode material layer and the underlying source and drain electrode material layer, with a via provided having smooth and sloped sidewalls over which the common electrode material extends to provide electrical contact between the common electrode material layer and the source and drain electrode material layer.

7 Claims, 3 Drawing Sheets

PHOTOSENSITIVE IMAGER CONTACT PAD STRUCTURE

This invention was made with U.S. Government support under Government Contract No. MDA 97294-30028 awarded by DARPA. The U.S. Government has certain rights in this invention.

FIELD OF THE INVENTION

This invention relates generally to photosensitive imagers and more particularly to a contact assembly for electrical connection to the photosensitive elements of such an imager.

BACKGROUND OF THE INVENTION

Photosensitive elements (for converting incident radiant energy into an electrical signal) are commonly formed into arrays for use in applications such as x-ray imagers and facsimile devices. Photosensitive elements, such as photodiodes, are formed in conjunction with necessary control or switching elements, such as thin film transistors (TFTs), in relatively large area arrays of such elements.

Photosensitive elements of the general type to which the present invention is applicable are described in the U.S. Pat. No. 5,233,181 of Robert F. Kwasnick and Jack D. Kingsley entitled "Photosensitive Element With Two Layer Passivation Coating", issued Aug. 3, 1993, and assigned to the same assignee as the present invention.

The photodiodes in the photodiode array are addressed by scan lines (rows) which switch the gate voltage of the TFTs associated with each photodiode allowing the charge collected on the photodiode to be transferred to columns of data lines which are connected by external connectors to read out circuitry. A common electrode layer at predetermined potential biases all of the photodiodes in parallel. The photodiode array is formed on a substrate and the scan lines, data lines and common electrode are electrically connected by contact fingers from the outside edge of the array to contact pads at the ends of the contact fingers. External connectors, typically flexible connectors with conducting lines on them, are pressed into contact with the contact pad surfaces to connect to and address the photodiode array.

The imager can be made sensitive to x-ray radiation by formation on the surface of, or coupling to, an X-ray sensitive scintillator. For environmental protection, the scintillator is sandwiched between a cover plate and the imager with the cover plate attached to the imager by a gasket adhering to both the cover plate and imager surfaces.

The contact pads differ from the contact fingers by necessarily having a conducting material on the exposed pad surface to which electrical contact is made. The conducting material is usually the common electrode material such as indium tin oxide (ITO) or a related transparent conducting material. The ITO connects to the underlying conducting materials which in turn connect to the array through vias formed in the dielectric layers. The vias are formed in the TFT passivation dielectric which typically is plasma enhanced chemical vapor deposition (PECVD) deposited silicon oxide (SiOx). It is desirable to avoid exposed conducting material in the contact finger region (the region between the contact pads and the array) of the imager because it can lead to excessive surface leakage between the contact fingers, corrosion, and degradation of imager performance.

In devices such as that described in the aforementioned U.S. Pat. No. 5,233,181, a two layer diode passivation dielectric is included in which the bottom layer is commonly PECVD silicon nitride (SiNx). Because adhesion of gasket material is better to SiOx than to SiNx, in such devices the SiNx is removed from the contact finger and contact pad region. It has been found that defects may occur if the SiNx is removed over the contact finger region by wet etching due to attack of the underlying SiOx during the overetch of the SiNx, especially at regions where the SiOx overlays steps formed by layers of underlying array components, such as edges of the source and drain metal or gate metal used in TFT formation. Accordingly, it is desirable to improve the sealing of the contact finger lines by the passivation of dielectric layers overlying the contact finger lines.

In addition, the contact vias in the contact pads in such devices do not inherently include a desired sloped profile or sides even though they are normally wet etched. At the relatively low temperature (about 250° C.) used in the PECVD of SiOx, the resultant contact via profile often has a vertical sidewall profile or even an overhanging profile after wet etch in an HF-based solution, typically a 10% solution of 10% HF buffered with $NH_4F$. An overhang has been observed not only with the use of tank wet etch, but also with the use of spin and spray tools. The resultant overhang increases the difficulty of forming an electrically continuous layer of ITO across the edges of the via from the top surface of the contact pad to the underlying metals which connect to the photodiode array. Since flexible external connectors only contact the top surfaces of the contact pads, discontinues ITO across the via edges results in uncontacted lines. Because an imager may have thousands of conducting lines, the ITO must make a very reliable connection across the via sidewall. Methods such as via bonding which would contact the bottom of the vias are not practical because of the thousands of bonds required.

It is thus desirable to provide an improved method of fabricating the electrical contact for a photosensitive element in which etching of the diode passivation layer does not adversely affect the underlying thin film transistor passivation dielectric and which provides improved yield and reliability of the common electrode contact to the underlying conductors, and in which the SiNx used as a diode passivation dielectric is removed from the contact finger region surrounding the array in order to improve the adherence of gasket materials used to seal the array.

SUMMARY OF THE INVENTION

In accordance with the present invention, a radiation imager comprises a photosensor array having photosensitive elements (such as photodiodes) disposed in a matrix type arrangement of pixels, with each photosensitive element being coupled to a respective row and column of address lines through a thin film transistor (TFT). Each address line comprises an electrical contact finger that extends from the array active area (e.g., array of photosensitive elements) towards the edge of the substrate.

The contact finger is formed with the deposition of a gate metal foundation disposed on the substrate, the deposition of a source-drain electrode (S-D) material platform over the gate and a surrounding gate dielectric layer; deposition of a TFT passivation layer over the S-D material platform; deposition of a diode passivation layer over the TFT passivation layer, formation of a via through the TFT passivation layer and diode passivation layer so as to expose a portion of the underlying S-D material platform, the via having sloped sidewalls; and the deposition of a common electrode material layer over the via to form the contact pad upper surface that is electrically connected to the S-D material platform. Upon completion of fabrication process, portions of the diode passivation are disposed between the overlying common electrode material and the underlying TFT passivation layer in the contact pad structure.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
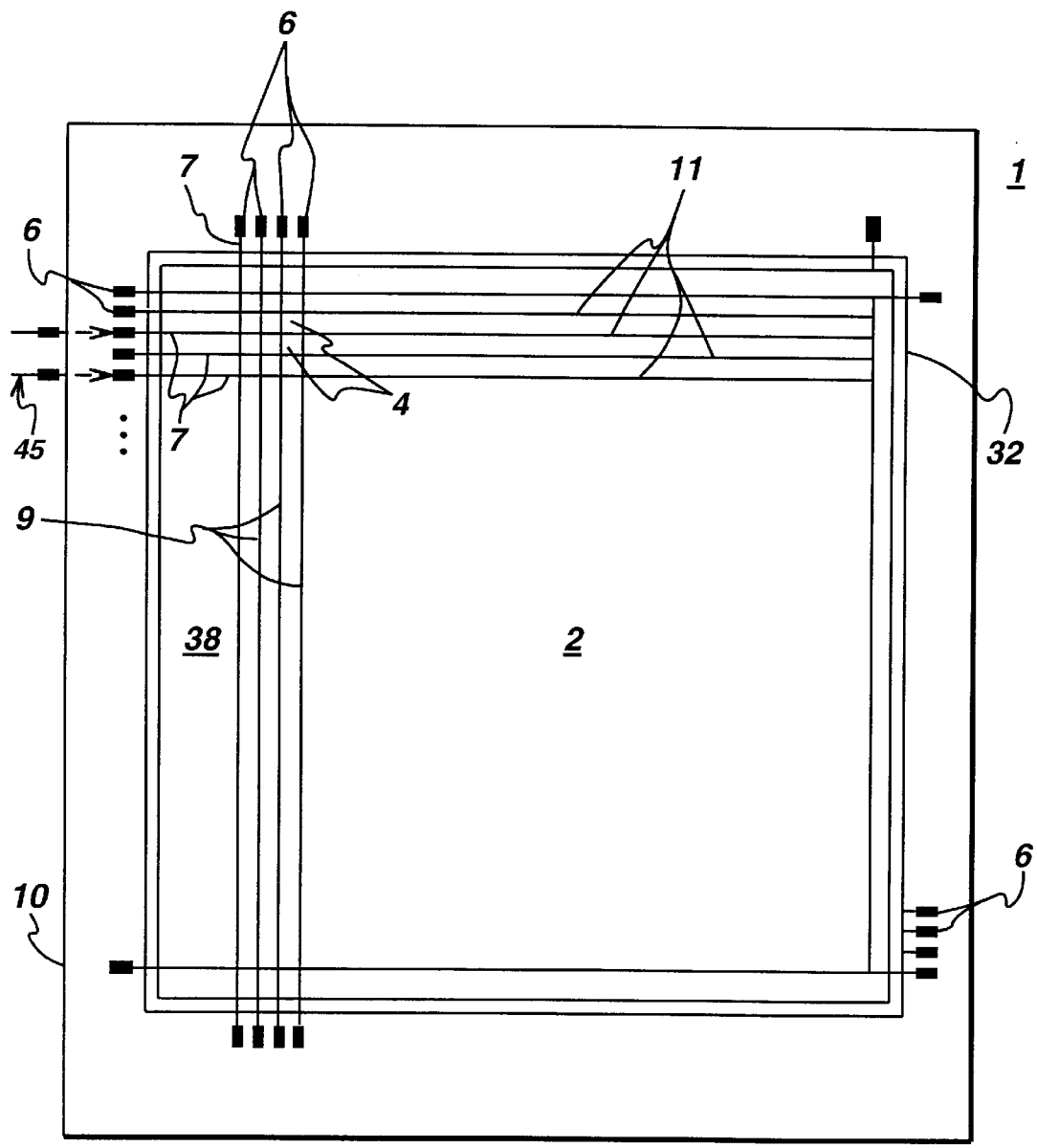
FIG. 1 is a simplified view of a photosensitive imager incorporating the invention.

Referring first to FIG. 1, photosensitive element array 1 includes an active imaging array 2 on insulating substrate 10 including pixels such as 4 between the intersections of horizontal scan lines 11 and orthogonal vertical data lines 9.

Each pixel 4 comprises a photosensitive element (not separately illustrated), such as a photodiode, comprising a semiconductive material, typically amorphous silicon (a-Si). Each pixel 4 further comprises a switching device (not separately illustrated), such as a thin film field effect transistor (TFT). The photodiode is respectively addressed via a respective TFT (not separately illustrated) by scan lines 11 to become conductive or non-conductive; when the gate of the TFT is biased by a signal on the scan line to cause the TFT to become conductive, charge stored in the photodiode can be conducted through the respective pixel TFT onto a respective data line coupled to that pixel TFT. Both scan lines 11 and data lines 9 extend outside of the active area of the array 2 in contact fingers 7 so that circuits (not shown) external to the array can be coupled to provide the biasing voltages on the scan lines and read out the diode charge from the data lines. Contact pads 6 are disposed at the end of each address line 9, 11 to provide a location to coupled such external electrical connections, for example by pressing a plastic flexible material with metal pads or lines (not shown) into contact with the contact pads.

Figure 2:
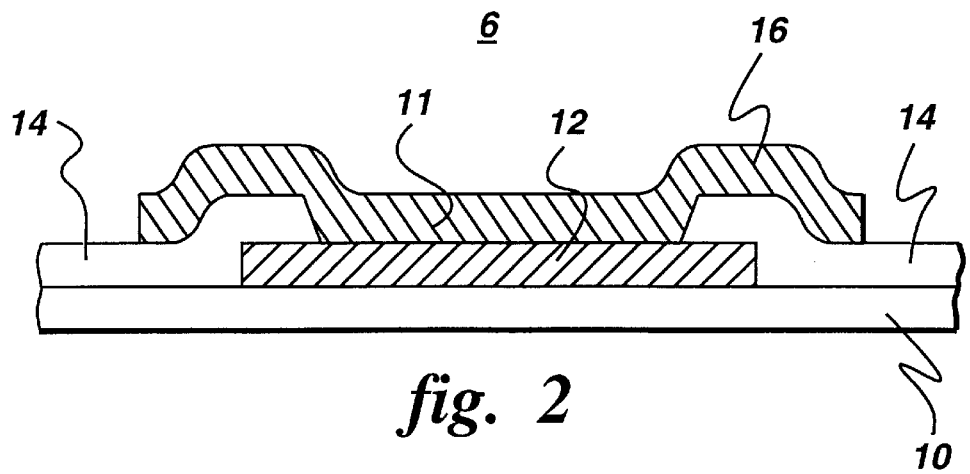
FIGS. 2–7 are cross-sectional views of the fabrication of an imager contact assembly in accordance with this invention.

Contact pad 6 is illustrated in FIG. 2 at a point in the fabrication process after the formation of the TFTs of imager 2. Gate layer 12 disposed on substrate 10 provides a foundation for contact pad 6 and typically comprises conductive material used in the formation of the gate electrodes in the TFTs in array 2. A gate dielectric layer 14 is disposed over the array and patterned so as to expose a central region upper surface 11 of gate layer 12 of contact pad 6. Source and drain electrode (S-D) conductive material is deposited and patterned on the array to form the source and drain electrodes for each TFT, and also to form an S-D material platform 16 in contact pad 6. S-D material platform 16 is typically deposited over the adjacent ends of gate dielectric 14 and overlies gate foundation 12 in central region 11 between the adjacent ends.

Figure 3:
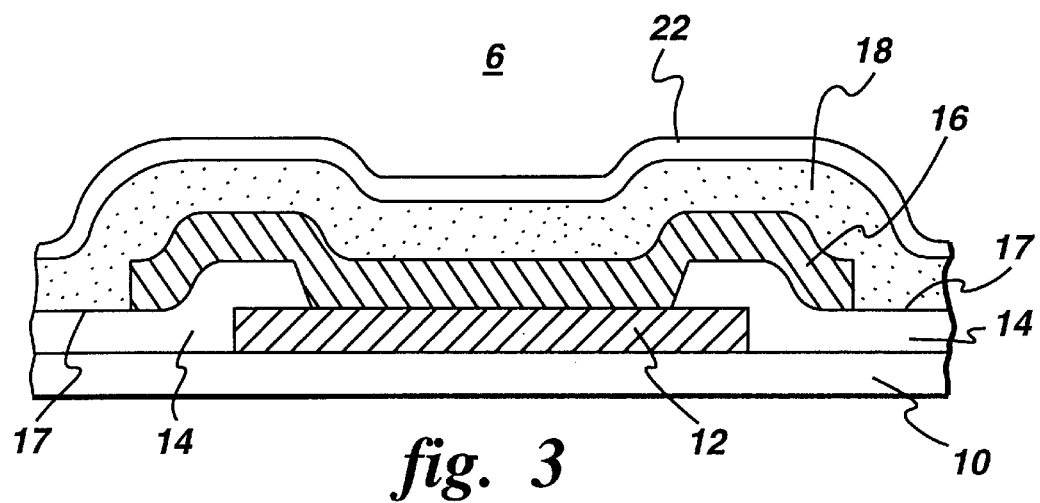

A thin film transistor passivation dielectric layer 18 (FIG. 3) is then deposited over S-D material platform 16 and regions 17 of gate dielectric layer 14 which extend beyond platform 16. Thin film transistor passivation dielectric 18 typically has a thickness of approximately 0.5 microns, but which thickness may be within a range from about 0.2 microns to about 1.0 microns, and typically comprises an inorganic dielectric material such as SiOx, which is commonly deposited by PECVD. Alternatively, TFT passivation dielectric may comprise $SiN_x$; although $SiO_x$ offers advantages with regard to etch selectively at later stages in the fabrication process (e.g., during the photodiode etch) and further provides advantages for bonding with the sealing gasket utilized in sealing the array of a large number of contiguous photosensitive elements. TFT passivation dielectric further may comprise a combination of $SiN_x$ and $SiO_x$, for example comprising a layer of $SiO_x$ is on top of the $SiN_x$, with the $SiO_x$ having sufficient thickness (such as 200 nanometers or more) to later stop the barrier dielectric etch (described below).

Semiconductive material such as a-Si is then deposited and patterned (e.g., in an RIE process) to form photodiodes bodies in each pixel 4 of array 2; the a-Si material is removed from the contact pad 6 region with an etch that is selective to the TFT passivation layer 18 (e.g., so that the etch is substantially stopped by the $SiO_x$ portion of TFT passivation dielectric layer).

Next, a diode passivation dielectric layer 22 is deposited over the array. Diode passivation layer typically comprises SiNx that is deposited in a PECVD process to have a thickness in the range between about 0.05 microns and 0.5 microns; typically the thickness of diode passivation layer is not greater than about 0.2 microns and commonly is about 0.1 micron. Diode passivation layer 22 is patterned over the photodiodes (not shown) to provide contact points to the diodes.

Figure 4:
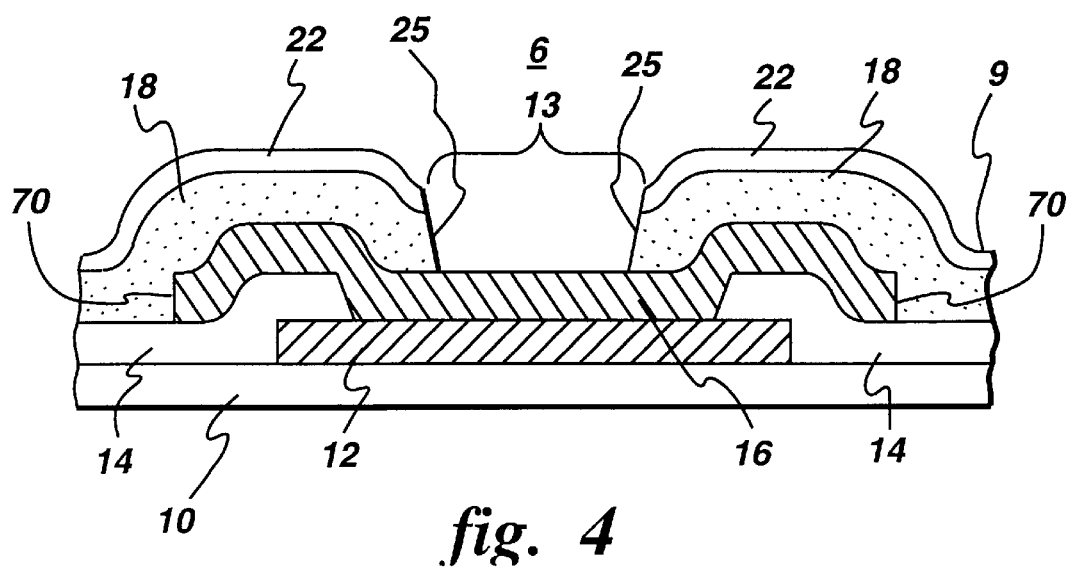

Respective contact vias 13 (FIG. 4) are formed in each respective contact pad 6 through diode passivation layer 22 and thin film transistor passivation dielectric 18 to expose S-D material foundation 16 at the bottom of the via. Via 13 is typically formed in a wet etch process in a diluted solution of buffered HF acid with the $SiN_x$ composition adjusted, for example, by varying the ratio of Si to N in the $SiN_x$ of diode passivation layer 22 so that the etch rate of the $SiN_x$ is faster than that of the $SiO_x$. The wet etch process will then form a sloped sidewall 25 in the via 13, rather than vertical sidewall. As used herein, "sloped sidewall" and the like refers to a non-vertical sidewall, typically providing a surface generally oriented off of vertical in the range between about 10° and about 45° (that is, approximately 10° less than vertical to 45° less than vertical).

TFT passivation dielectric 18 is most stressed at steps 70 (FIG. 4) at the edge of S-D material platform 16. These highly stressed areas of TFT passivation dielectric layer 18 will etch the fastest during any subsequent overetch, especially those etching steps performed with wet etchants. As a result, it is possible that a S-D material platform 16 can be exposed if diode passivation dielectric 22 were wet etched away from the region overlying steps 70 (as in prior art) during formation of vias in the diode passivation dielectric 22 (e.g., formation of contacts to photodiodes in array 2). It is thus important that contact pad via 13 be formed through passivation layers 18 and 22 in a patterning step that does not remove diode passivation layer outside of the via region 13. Thus, the $SiN_x$ of diode passivation layer 22 remains in the region outside the active area of the photosensitive array to provide protection and further to provide a suitable surface for the subsequent application and bonding of other components to the array.

In the course of the fabrication of the array, an additional dielectric barrier material (not shown) such as a polyimide for use in protecting other components in the array is typically deposited and then etched away from the area around contact pad 6.

Figure 5:
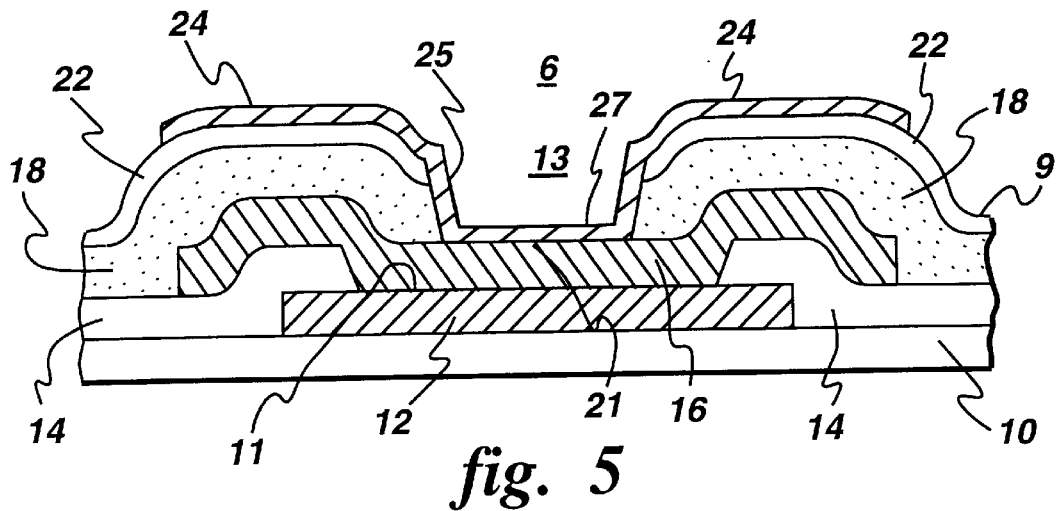

Next, a common electrode material layer 24 (FIG. 5) is deposited and patterned. Common electrode material layer 24 typically comprises an optically transmissive conductive material such as indium tin oxide (ITO) or the like. Common electrode material layer 24 typically has a thickness of approximately 0.1 microns, but can have a thickness in a range of between about 0.05 microns and about 0.2 microns. The ITO material is patterned to form the contact pad 6 structure 24 illustrated in FIG. 5; the ITO is further patterned over the photodiodes in the array (not shown). Common electrode material contact pad island 24 provides the electrically conducting surface of contact pad 6 and common electrode material contact pad island 24 overlies sidewalls 25 of diode passivation layer 22 and TFT passivation layer 18, and island 24 also contacts S-D material platform 16.

Figure 6:
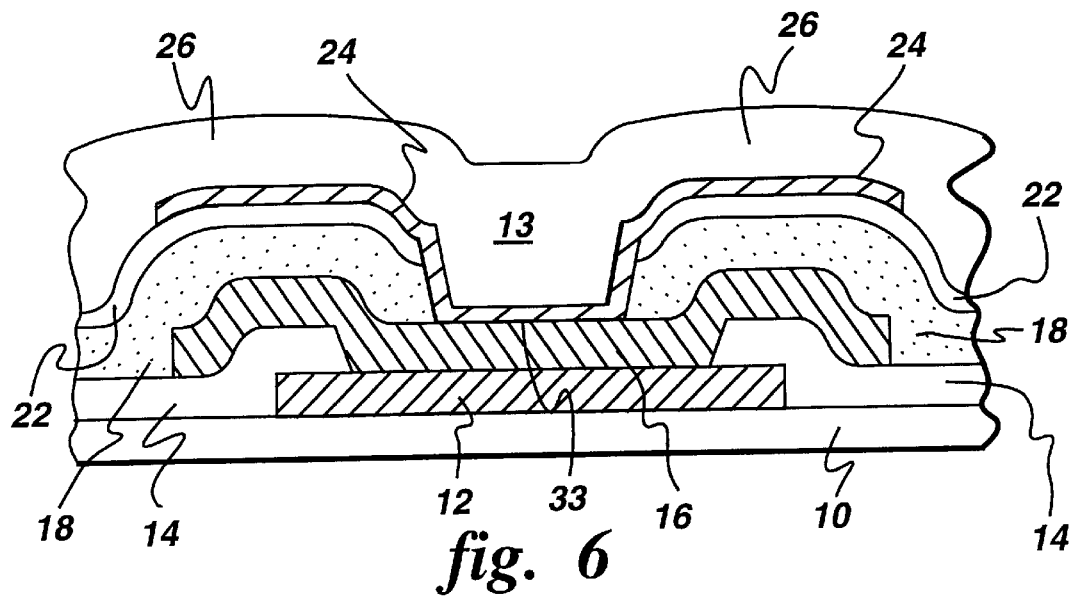

Next, a barrier layer 26 (FIG. 6) is deposited over the imager to protect the radiation array from moisture and to further provide an adhesion layer for the subsequent deposition of a scintillator material on array 2. Barrier layer 26 typically comprises SiNx that has a thickness in the range between about 0.5 microns to about 1.5 microns. In the region of contact pad 6, barrier layer 26 is etched away (exposing common electrode material layer 24 and via 13), preferably by reactive ion etching and, during the same etching step, diode passivation dielectric 22 is removed, where it is exposed past the edges of common electrode 24, to complete contact pad 6 structure shown in FIG. 7. The reactive ion etching is typically controlled by monitoring the amount of nitrogen ultraviolet emission in the plasma by a spectrometer, enabling the etch to be stopped on the underlying SiOx of TFT passivation dielectric 18 (the use of an etch chemistry combining $CF_4$ and $O_2$ provides appropriate selectivity). The etch ratio of the $SiN_x$ of diode passivation dielectric 22 to the $SiO_x$ of TFT passivation dielectric 18 is about two to one in this chemistry. RIE etching greatly reduces the attack of the underlying $SiO_x$ TFT passivation dielectric 18, especially at the edges of gate material layer 12 and S-D material platform 16 and along contact fingers 7, relative to a wet etch process. Etching of barrier dielectric 26 is stopped on TFT passivation layer 18 to retain and not damage this layer, particularly where it crosses the steps 70 of underlying S-D material platform 16.

Figure 7:
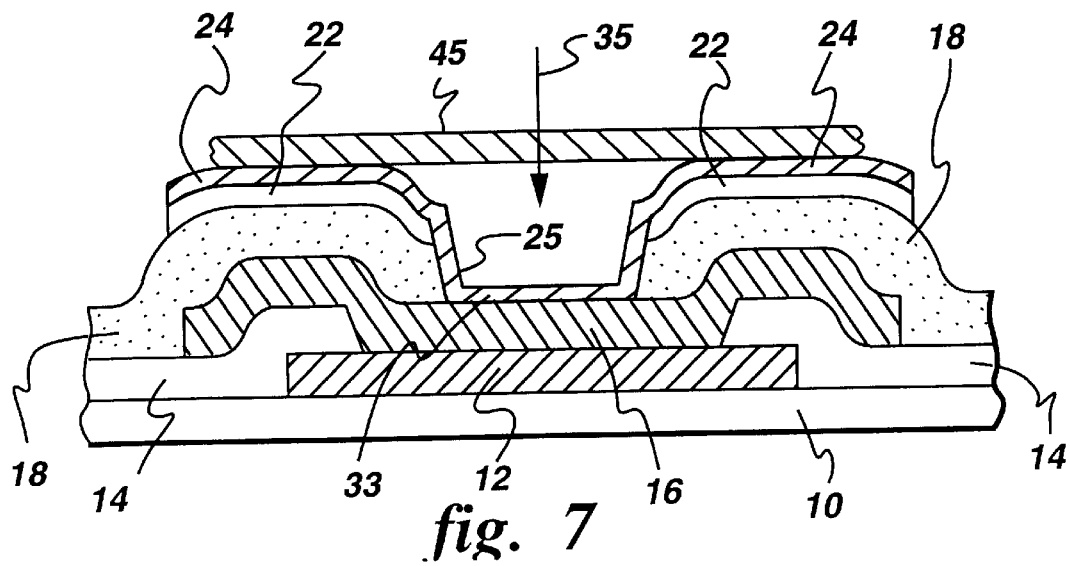

Electrical contact from the outside of the array is made through a flexible contact attachment 45 (FIG. 7) which typically comprises a plastic flexible material with metal pads or conductors for contacting contact pads 6. Flexible contact attachment 45 is disposed in electrical contact with contact pad 6 (the arrow in FIG. 7 illustrating the fabrication step of disposing the attachment 45 in electrical contact with the conductive structure of contact pad 6).

Fabrication of the photosensitive imager typically further includes depositing a scintillator such as CsI over the imaging array. An epoxy gasket (not shown) is applied around the perimeter of the array and a protective cover is applied sandwiching the array between the cover and substrate for protection against ambient environmental conditions. As the diode passivation layer is typically coextensive with (that is, underlies but does not extend significantly beyond) the common electrode material layer after the processing steps described above, the gasket is thus typically in contact with the SiOx of TFT passivation layer because of the removal of diode passivation dielectric in the region outside of the contact pad area. The TFT passivation layer provides a good surface for the adhesive used to bond cover in place.

The sloped sidewalls 24 of via 13 provide a substantially smooth and faired surface (that is, without substantial surface discontinuities between TFT passivation layer 18 and diode passivation layer 22) that enables the ITO material layer 24 to be form a high integrity electrical contact with S-D material foundation 16. The smooth and faired sidewall surface 25 thus improves the reliability and yield of the common electrode contact 24, which material forms 15 the portion of contact pad 6 to which external electrical contact pads 45 are coupled to provide electrical connection to components off of the array.

While only certain features of the invention have been illustrated and described herein, modifications and changes will occur to those skilled in the art. It is, therefore, to be understood that the appended claims are intended to cover such modifications and changes that fall within the true spirit of the invention.

What is claimed is:

1. A radiation imager comprising:

a photosensor array disposed on a substrate; said photosensor array comprising a plurality of photosensor elements, each of said photosensor elements being coupled to a respective thin film transistor (TFT), said plurality of photosensor elements and respective TFTs being disposed in a matrix arrangement;

each of said photosensors being fabricated with a plurality of materials, including a photosensor passivation material and an electrically conductive common electrode material;

each of TFTs being fabricated with a plurality of materials, including an electrically conductive gate material, an electrically conductive source-drain material, and a TFT passivation material;

said photosensor array further comprising a plurality of conductive address lines disposed in said array so as to respectively address each of said photosensor elements in said array, each of said address lines comprising a contact finger disposed outside a boundary of said matrix arrangement of photosensor elements to provide for electrical contact to components external to said photosensor array;

each of said contact fingers terminating in a contact pad, each of said contact pads comprising materials also used in the fabrication of components in said photosensor array, each of said contact pads comprising a common electrode material upper layer and an underlying source and drain electrode (S-D) material layer, each of said contact pads further comprising a thin film transistor (TFT) passivation layer and a photosensor passivation layer disposed between portions of said common electrode material layer and said S-D material layer.

2. The imager of claim 1 wherein said common electrode material layer is disposed in electrical contact with said S-D material layer through a via extending through said TFT passivation layer and said photosensor passivation layer, said via having sloped sidewalls over which said common electrode extends.

3. The imager of claim 2 wherein said sloped sidewalls are generally oriented off of vertical in the range of about 10° to about 45° and said sidewalls are faired such that no substantial surface discontinuity exists between portions of said photosensor passivation layer and said TFT passivation layer that form said sidewall.

4. The imager of claim 1 wherein said photosensor passivation layer is disposed over said contact finger coextensive with said common electrode material layer.

5. The imager of claim 1 wherein said TFT passivation layer comprises a material selected from the group consisting of silicon oxide ($SiO_x$) and said photosensor passivation layer comprises a material selected from the group consisting of silicon nitride (SiNx).

6. The imager of claim 5 wherein said TFT passivation layer has a thickness in the range between about 0.2 microns and about 1 micron and said photosensor passivation layer has a thickness in the range between about 0.05 microns and about 0.5 microns.

7. The imager of claim 1 wherein said common electrode material layer comprises indium tin oxide.

* * * * *